United States Patent
Shi et al.

(10) Patent No.: US 11,075,642 B2
(45) Date of Patent: Jul. 27, 2021

(54) LINEAR CALIBRATION SYSTEM AND METHOD FOR TIME-TO-DIGITAL CONVERTER AND DIGITAL PHASE-LOCKED LOOP

(71) Applicant: Montage LZ Technologies (Chengdu) Co., Ltd., Chengdu (CN)

(72) Inventors: Mingfu Shi, Chengdu (CN); Shunfang Wu, Chengdu (CN); Shen Feng, Chengdu (CN); Jun Xu, Chengdu (CN); Xinwu Cai, Chengdu (CN); Taibo Dong, Chengdu (CN)

(73) Assignee: Montage LZ Technologies (Chengdu) Co., Ltd., Chengdu (CN)

( * ) Notice: Subject to any disclaimer, the term of this patent is extended or adjusted under 35 U.S.C. 154(b) by 0 days.

(21) Appl. No.: 17/134,530

(22) Filed: Dec. 28, 2020

(65) Prior Publication Data
US 2021/0203340 A1    Jul. 1, 2021

(30) Foreign Application Priority Data
Dec. 26, 2019    (CN) .......................... 201911362570.4

(51) Int. Cl.
  *H03M 1/10*    (2006.01)
  *H03L 7/093*   (2006.01)
  *G04F 10/00*   (2006.01)
  *H03L 7/099*   (2006.01)
  *H03L 7/081*   (2006.01)

(52) U.S. Cl.
  CPC ........ *H03M 1/1033* (2013.01); *G04F 10/005* (2013.01); *H03L 7/0814* (2013.01); *H03L 7/093* (2013.01); *H03L 7/099* (2013.01)

(58) Field of Classification Search
  CPC .. H03M 1/1033; G04F 10/005; H03L 7/0814; H03L 7/099
  USPC .................................. 327/147–149, 156–158
  See application file for complete search history.

(56) References Cited

U.S. PATENT DOCUMENTS

| | | | | |
|---|---|---|---|---|
| 10,895,850 B1* | 1/2021 | Elkholy | .................. | H03M 1/34 |
| 2011/0084863 A1* | 4/2011 | Chiu | ..................... | G04F 10/005 |
| | | | | 341/141 |
| 2013/0191061 A1* | 7/2013 | Wang | .................... | G04F 10/005 |
| | | | | 702/66 |
| 2014/0077841 A1* | 3/2014 | Jia | .......................... | H03L 7/087 |
| | | | | 327/3 |

(Continued)

*Primary Examiner* — Adam D Houston

(57) ABSTRACT

The present disclosure provides a linear calibration system for a time-to-digital converter and a method thereof, and a digital phase-locked loop. The linear calibration system includes a digitally controlled reference delay circuit for receiving a first clock signal and delaying the first clock signal to generate a reference clock signal, a time-to-digital conversion circuit including at least two time-to-digital converters, and a state machine. The time-to-digital conversion circuit receives the first clock signal and the reference clock signal, delays the first clock signal to generate a first delay signal, compares a phase of the first delay signal with a phase of the reference clock signal, and outputs a phase detection result signal. The state machine generates a delay control signal for controlling the digitally controlled reference delay circuit, adjusts a calibration control signal to align the phases of the first delay signal and the reference clock signal.

20 Claims, 12 Drawing Sheets

(56) References Cited

U.S. PATENT DOCUMENTS

| | | | |
|---|---|---|---|
| 2014/0266848 A1* | 9/2014 | Henzler | G04F 10/005 |
| | | | 341/166 |
| 2014/0333358 A1* | 11/2014 | Kim | H03L 7/1974 |
| | | | 327/159 |
| 2017/0187383 A1* | 6/2017 | Lesso | H03L 7/0995 |
| 2017/0264304 A1* | 9/2017 | Dedic | H03L 7/091 |
| 2018/0267480 A1* | 9/2018 | Mahajan | G05F 1/561 |
| 2020/0177190 A1* | 6/2020 | Shumaker | H03L 7/1806 |
| 2020/0363774 A1* | 11/2020 | Fujimoto | H03M 1/50 |

* cited by examiner

LINEAR CALIBRATION SYSTEM AND METHOD FOR TIME-TO-DIGITAL CONVERTER AND DIGITAL PHASE-LOCKED LOOP

CROSS REFERENCE TO RELATED APPLICATION

The present application claims the benefit of priority to Chinese Patent Application No. 2019113625704, entitled "linear calibration system and method for time-to-digital converter and digital phase-locked loop", filed with CNIPA on Dec. 26, 2019, the disclosure of which is incorporated herein by reference in its entirety.

TECHNICAL FIELD

The present disclosure generally relates to electronic circuits, in particular to a linear calibration system for a time-to-digital converter and a digital phase-locked loop.

BACKGROUND

With rapid development of the semiconductor industry, the level of integration of electronic devices (such as transistors, diodes, resistors, capacitors, etc.) has been greatly improved, and an all-digital phase-locked loop (ADPLL) with high performance and low power consumption have been realized and used for system integration.

ADPLL replaces the analog components in traditional analog phase locked loops with digital components and adopts a different digital circuit structure with the traditional analog phase locked loops. A core component in ADPLL is a time-to-digital converter (TDC), which converts time information into encoded digital signals. However, due to semiconductor process variations, TDC in the prior art has low resolution, a complex circuit structure, and high power consumption, and lacks high accuracy.

Therefore, there is a need to provide a linear calibration system and method, and a corresponding digital phase-locked loop to avoid low resolution or low accuracy of prior art TDC due to semiconductor process variations.

SUMMARY

An embodiment of the present disclosure provides a linear calibration system for a time-to-digital converter. The linear calibration system for a time-to-digital converter includes: a digitally controlled reference delay circuit, a time-to-digital conversion circuit, and a state machine. In a calibration mode, the digitally controlled reference delay circuit receives a first clock signal, delays the first clock signal, and outputs a reference clock signal; the time-to-digital conversion circuit is connected to the digitally controlled reference clock signal and comprises at least two time-to-digital converters, and the time-to-digital converters receive the first clock signal and the reference clock signal, delay the first clock signal to output a first delay signal, compare the phase of the first delay signal with the phase of the reference clock signal, and output a phase detection result signal, and the state machine is connected to the digitally controlled reference delay circuit and the time-to-digital conversion circuit, generates one delay control signal controlling the digitally controlled reference delay circuit for each of the time-to-digital converters, and adaptively adjusts a calibration control signal for calibrating the time-to-digital converters according to the phase detection result signal, so as to align the phase of the first delay signal and the phase of the reference clock signal.

Another embodiment of the present disclosure provides a linear calibration method for a time-to-digital converter. For each of a plurality of time-to-digital converters, the method comprises: receiving a first clock signal, delaying the first clock signal to generate a first delay signal; receiving the first clock signal, delaying the first clock signal to generate a reference clock signal; comparing the phase of the first delay signal and the phase of the reference clock signal and outputting a phase detection result signal; and adjusting a calibration control signal which calibrates the time-to-digital converter, according to the phase detection result signal, so as to align the phase of the first delay signal and the phase of the reference clock signal.

Another embodiment of the present disclosure provides a digital phase-locked loop, which comprises: a decoder, a digitally controlled reference delay circuit, a time-to-digital conversion circuit, and a state machine. The digitally controlled reference delay circuit, the time-to-digital conversion circuit, and the state machine can be a digitally controlled reference delay circuit, a time-to-digital conversion circuit, and a state machine disclosed by some embodiments of the present disclosure. The decoder is connected to the time-to-digital conversion circuit, and when the time-to-digital conversion circuit is in the working mode, the time-to-digital conversion circuit measures the phase difference between the first clock signal and the second clock signal and outputs the phase detection result signal to the decoder, and the decoder decodes the phase detection result signal into a binary output.

DETAILED DESCRIPTION

One or more specific embodiments of the present disclosure will be described below. These described embodiments are only examples of the presently disclosed techniques, and are not intended to limit aspects of the presently disclosed invention. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The linear calibration system and method for a time-to-digital converter, and digital phase-locked loop described in the present disclosure can calibrate several parallel output digital signals of the time-to-digital converter for linearization.

Figure 1:
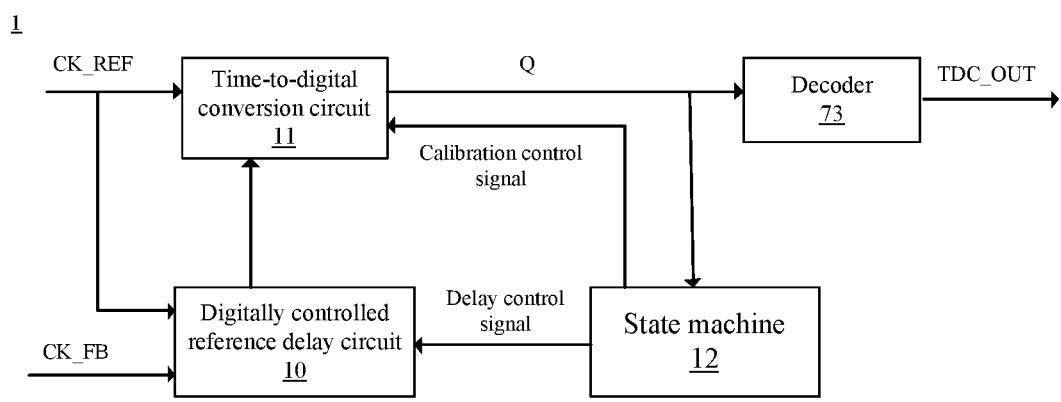
FIG. 1 is a block diagram of a linear calibration system for a time-to-digital converter according to an embodiment of the present disclosure.

Referring to FIG. 1, a linear calibration system for a time-to-digital converter is provided by an embodiment of the present disclosure. The linear calibration system 1 for a time-to-digital converter includes a digitally controlled reference delay circuit 10, a time-to-digital conversion circuit 11, and a state machine 12. The digitally controlled reference delay circuit 10 receives a first clock signal, and delays the first clock signal CK_REF to generate a reference clock signal CKS. The time-to-digital conversion circuit 11 is connected to the digitally controlled reference delay circuit 10, the time-to-digital conversion circuit 11 receives the first clock signal and the reference clock signal, delays the first clock signal to generate a first delay signal, compares the phases of the reference clock signal and the first delay signal, and outputs a phase detection result signal. The state machine 12 is connected to the digitally controlled reference delay circuit 10 and the time-to-digital conversion circuit 11, generates a delay control signal for controlling the digitally controlled reference delay circuit 10 in a calibration mode, and according to the phase detection result signal, adaptively adjusts a calibration control signal for adjusting the time-to-digital conversion circuit 11, so as to align the phases of the first delay signal and the reference clock signal.

Figure 2A:
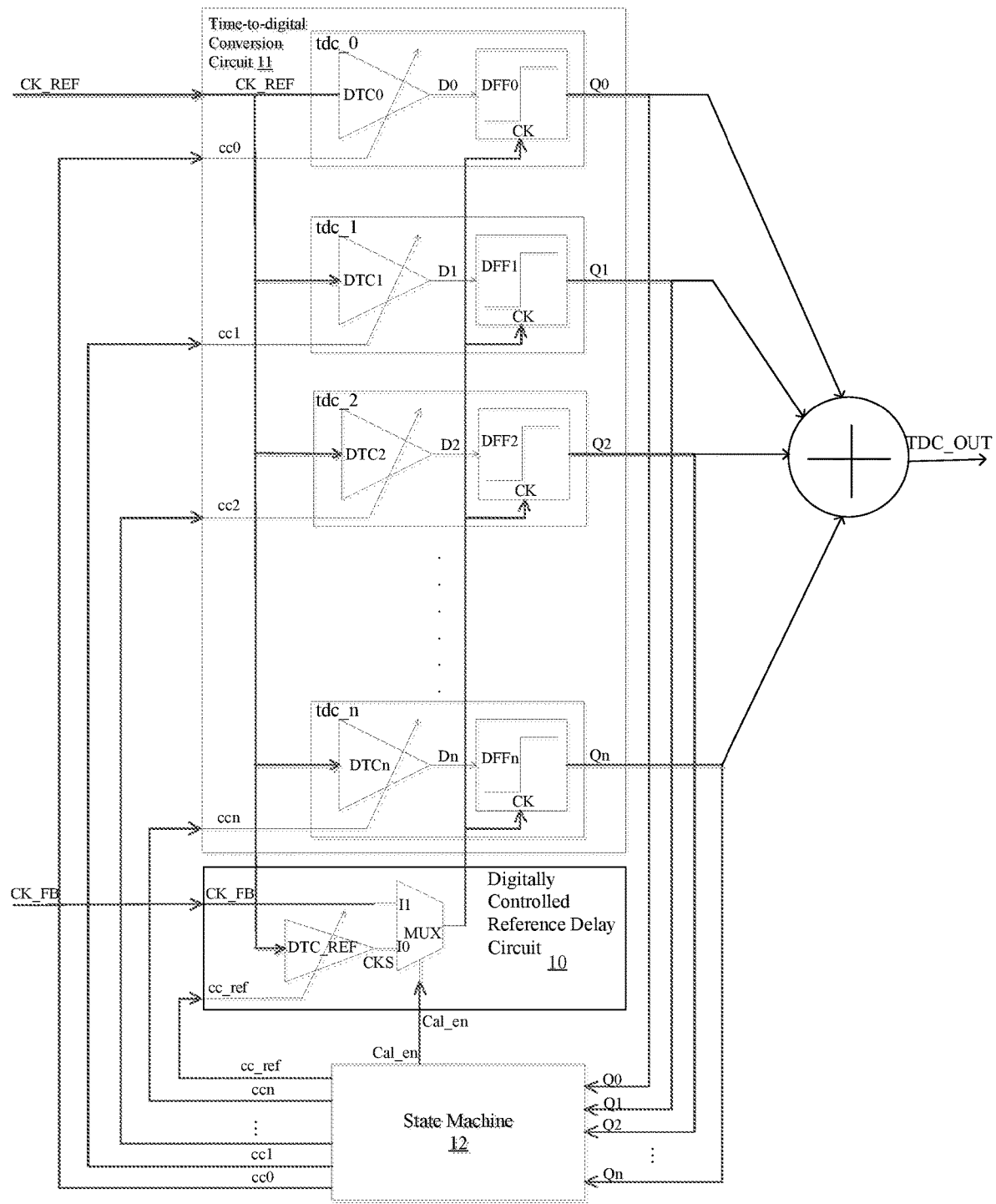
FIG. 2A is a schematic diagram of a linear calibration system for a time-to-digital converter according to an embodiment of the present disclosure.

FIG. 2A is a circuit diagram of a linear calibration system for a time-to-digital converter according to an embodiment of the present disclosure. As shown in FIG. 2A, the digitally controlled reference delay circuit 10 includes a digitally controlled reference delay line DTC-REF, which in the calibration mode, receives a first clock signal CK_REF and delays the first clock signal CK_REF under control of a delay control signal cc_ref output by the state machine 12 to output a reference clock signal.

In some embodiments, the digitally controlled reference delay circuit also includes a selector MUX, which includes a first receiving terminal 10 and a second receiving terminal 11. The first receiving terminal 10 is connected to a digitally controlled reference delay line for receiving the reference clock signal. The second receiving terminal 11 receives a second clock signal CK_FB. The selector MUX, under control of a calibration enabling signal cal_en output by the state machine, selects one of the signals for output. For example, in the calibration mode, the calibration enabling signal cal_en=1 selects the reference clock signal CKS for output, and after the calibration mode ends, that is, in a working mode, the calibration enabling signal cal_en=0 selects the second clock signal for output, thereby switching the time-to-digital conversion circuit between the calibration mode and the working mode.

The time-to-digital conversion circuit 11 includes at least two time-to-digital converters tdc0, tdc1, . . . , tdcn, where n is a natural number greater than or equal to 2. Each the time-to-digital converter tdc_i includes a digitally controlled delay line DTCi, and a phase detector DFFi connected to the digitally controlled delay line DTCi and the digitally controlled reference delay circuit. The digitally controlled delay line DTCi receives the first clock signal CK_REF, delays the first clock signal CK_REF, and outputs a first delay signal Di. The phase detector DFFi compares the first delay signal Di and the reference clock signal CKS and outputs a signal Qi, where i=0, 1, 2, 3, . . . n.

In some embodiments, the phase detector is a D flip-flop. An input terminal of the D flip-flop receives the first delay signal, a flip-flop control terminal of the D flip-flop, in the calibration mode, receives the reference clock signal CKS. The flip-flop control terminal may be connected to the digitally controlled reference delay line DTC-REF, in some embodiments, the flip-flop control terminal may be connected to an output terminal of the selector MUX.

Figure 2B:
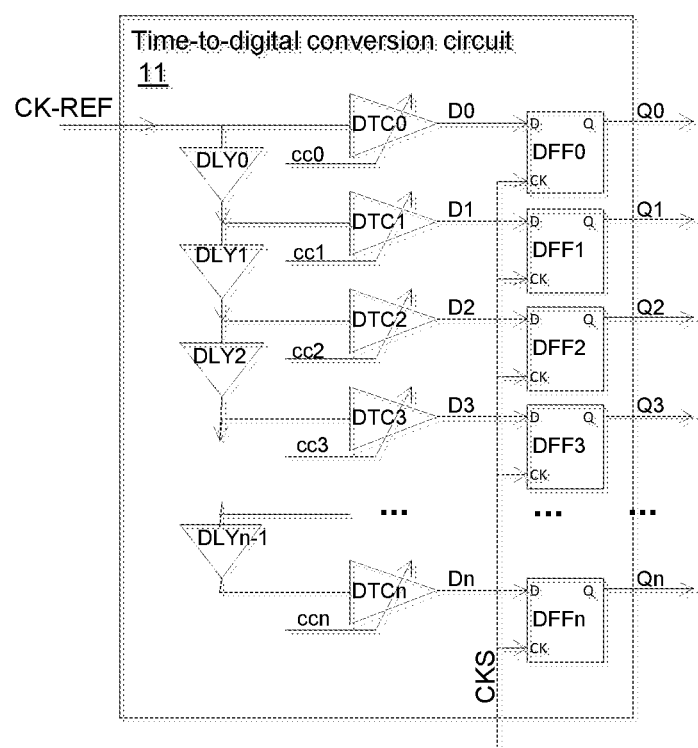
FIG. 2B is a circuit diagram of a time-to-digital conversion circuit according to an embodiment of the present disclosure.

In some embodiments, as shown in FIG. 2B, the time-to-digital conversion circuit 11 includes at least two time-to-digital converters and a delay line DLYi between two adjacent time-to-digital converters. Each the time-to-digital converter includes a digitally controlled delay line DTCi and a phase detector DFFi. The digitally controlled delay line DTCi and the phase detector DFFi are connected. The delay line DLYi may reduce an adjustable delay time range of each of digitally controlled delay lines (or time-to-digital converters) behind it.

Referring to FIG. 2A, for each time-to-digital converter tdc_i, the state machine 12, in the calibration mode, adjusts a delay control signal cc_ref for controlling the digitally controlled reference delay line DTC-REF to delay the reference clock signal, adjusts a calibration control signal cci according to a phase comparison result of the reference clock signal CKS and first delay signal Di (that is, according to the phase detection result signal output by the phase detector), so as to adjust the time-to-digital converter tdc_i until the phases of the first delay signal Di and the reference clock signal CKS are aligned.

More specifically, the state machine 12 generates delay control signal cc_ref for controlling the digitally controlled reference delay line DTC-REF to delay the reference clock signal, and adjusts the calibration control signal cci according to a phase detection result signal Qi, so as to control the time-to-digital converter tdc_i to adjust a rising edge or falling edge of the first delay signal Di until the rising edge or falling edge of the first delay signal Di are aligned with a rising edge or falling edge of the reference clock signal CKS (when the rising edges or falling edges of the first delay signal Di and reference clock signal CKS are aligned, the phases of the first delay signal Di and reference clock signal CKS are aligned). The phase detection result signal Qi indicates whether or not rising edges or falling edges of the first delay signal Di and the reference clock signal CKS are aligned. When the edges are aligned, calibration of the time-to-digital converter tdc_i is completed, and the state machine 12 keeps the calibration control signal cci unchanged to keep the first delay signal Di in an adjusted phase. In some embodiments, the state machine 12 adjusts the delay control signal to make cc_ref=cc_ref+1, so as to shift the reference clock signal CKS forwardly by a unit phase shift. The signal obtained after the phase of the reference clock signal CKS is shifted becomes the corresponding reference clock signal for the next time-to-digital converter tdc_(i+1) to be adjusted.

After the state machine 12 finishes adjusting the last time-to-digital converter tdc_n, calibration of the time-todigital conversion circuit is completed, the selector MUX selects the second clock signal CK_FB (that is, the state machine 12 outputs a calibration enabling signal cal_en=0), and the time-to-digital conversion circuit switches to the working mode.

The linear calibration system of a time-to-digital converter may also include an adder, which is connected to the time-to-digital conversion circuit, so as to accumulate or decode the phase detection result signal Qi into a binary output TDC_OUT.

Some operations of the linear calibration system of a time-to-digital converter are as follow:

Before the time-to-digital conversion circuit operates in the working mode, the digitally controlled reference delay line DTC_REF is adjusted to shift the phase of the reference clock signal CKS step by step; each time the reference clock signal CKS is shifted forwardly by a unit phase shift, the calibration control signal cci of the time-to-digital converter tdc_i is adjusted to align the phases of Di and CKS. In some embodiments, the phases are aligned when the average value of the phase detection result signal Qi is approximately half of the sum of the high level and the low level of the phase detection result signal Qi, and so on. After adjustment, the first delay signals D0, D1, . . . , Dn can be evenly distributed in corresponding phase reference positions, so as to linearize the time-to-digital conversion circuit. The linearity of the time-to-digital conversion circuit depends on the linearity of the digitally controlled reference delay line DTC_REF and the accuracy of the digitally controlled delay lines DTC0 to DTCn, and a high linearity of the digitally controlled reference delay line DTC_REF and a high accuracy of the digitally controlled delay lines DTC0 to DTCn can be easily realized in the circuit.

It is worth noting that mismatch between the phase detectors does not affect the linearity of the time-to-digital conversion circuit TDC, because when the time-to-digital conversion circuit TDC operates in the working mode, the second clock signal is connected to the same phase detectors as the first clock signal.

In summary, the linear calibration system of a time-to-digital converter calibrates the phase of an output signal of each time-to-digital converter before the time-to-digital conversion circuit enters the working mode, so that the time-to-digital conversion circuit outputs signals evenly distributed in corresponding reference positions, so that the time-to-digital converters are digitalized, and the performance of the time-to-digital converter is hardly deviated with variations in process, temperature and voltage, which can improve the resolution and linearity of the time-to-digital converter.

Figure 3:
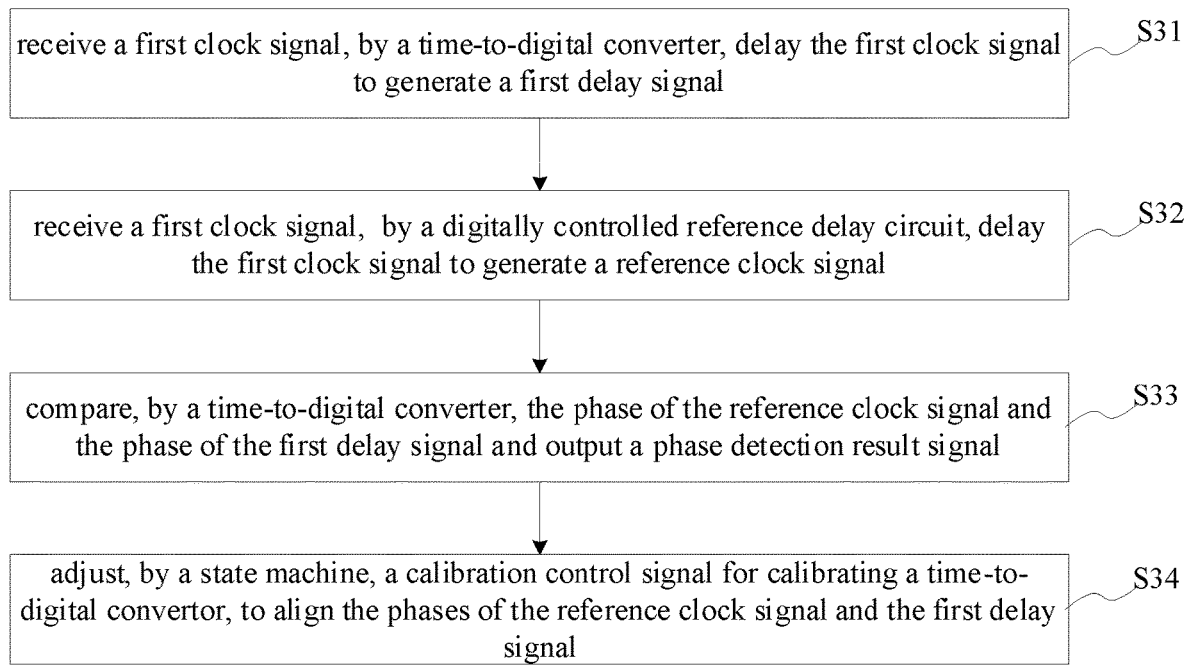
FIG. 3 is a flowchart illustrating a linear calibration method for a time-to-digital converter according to an embodiment of the present disclosure.

FIG. 3 is a flowchart illustrating various steps of a linear calibration method for a time-to-digital converter. The linear calibration method for a time-to-digital converter can be performed by embodiments illustrated by FIGS. 1, 2A and 2B. The linear calibration method for a time-to-digital converter includes:

at S31, receiving a first clock signal, delaying the first clock signal to generate a first delay signal;

at S32, receiving a first clock signal, delaying the first clock signal to generate a reference clock signal;

at S33, comparing the phases of the reference clock signal and the first delay signal and outputting a phase detection result signal; and at S34, according to the phase detection result signal, adjusting a calibration control signal used for controlling a time-to-digital converter, so as to align the phases of the first delay signal and the reference clock signal.

Although the operations of the linear calibration method for a time-to-digital converter are described in a specific order herein, this does not require or imply that these operations be performed in the specific order. On the contrary, the operations depicted in the flowcharts can be executed in a different order. Additionally or alternatively, some operations can be omitted, multiple operations can be combined into one operation, and/or one operation can be divided into multiple operations.

With reference to FIG. 2A and FIG. 3, the linear calibration method is described by calibrating the time-to-digital converter tdc_i (i=0, 1, 2, 3, . . . , n) as an example:

First, the time-to-digital converter tdc_i receives and delays the first clock signal CK_REF, and then generates the first delay signal Di;

Second, the digitally controlled reference delay line DTC-REF, under control of the delay control signal cc_ref output by the state machine, delays the first clock signal CK_REF it receives, and outputs the reference clock signal CKS;

Third, the phase detector determines whether the rising edge or falling edge of the first delay signal Di are aligned with the rising edge or falling edge of the reference clock signal CKS, and output the phase detection result signal Qi to the state machine 12.

Fourth, the state machine 12, according to the value of the phase detection result signal Qi, adjusts the calibration control signal cci, so as to control the time-to-digital converter to adjust the rising edge or falling edge of the first delay signal Di until the rising edges or falling edges of the first delay signal Di are aligned with the rising edge or falling edge of the reference clock signal CKS. Then the state machine 12 keeps the calibration control signal cci unchanged, to keep the first delay signal Di in an adjusted phase (that is, the phase of the first delay signal Di stays the same after it is adjusted). Alternatively, the state machine 12 adjusts the delay control signal cc_ref of the digitally controlled reference delay line, so as to shift the phase of the reference clock signal CKS forwardly by at least a unit phase shift (that is, cc_ref=cc_ref+1), and the signal obtained after the phase of the reference clock signal CKS is shifted becomes a corresponding reference clock signal for the next time-to-digital converter tdc_(i+1) to be adjusted.

Herein, the rising edges or falling edges of the first delay signal Di and the reference clock signal CKS are aligned when the average value of the phase detection result signal Qi is approximately half of the sum of the high level and the low level of the phase detection result signal Qi. For example, hypothetically the high level of Qi is 1 and the low level is 0, and when the average value of Qi is approximately 0.5, the rising edges or falling edges are aligned. For example, hypothetically the high level is 1 and the low level is −1, and when the average value of Qi is about 0, the rising edges or falling edges are aligned.

In some embodiments, the time-to-digital converter can be calibrated one by one in the order of arrangement. FIGS. 4A to 4G show schematic diagrams of a calibration process of sequentially calibrating a first delay signal of each time-to-digital converter with n=7 as an example according to some embodiments.

Figure 4A:
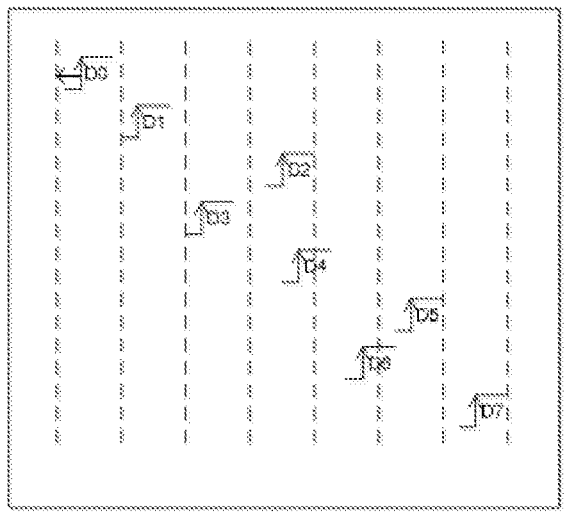
FIGS. 4A to 4G show schematic diagrams of a calibration process of sequentially calibrating first delay signals of a time-to-digital converter with n=7 as an example according to an embodiment of the present disclosure.

More specifically, FIG. 4A shows each time-to-digital converter outputting an unadjusted first delay signal. In FIGS. 4B to 4G, P0 to P7 represent different phase shift positions of the reference clock signal CKS, that is, reference phase positions of time-to-digital converters tdc_0 to tdc_7. Sequential calibration is to calibrate the first delay signals output by digitally controlled reference delay lines DTC0 to DCT7 one by one according to the arrangement order of time-to-digital converters tdc_0 to tdc_7, and finally all the first delay signals are distributed in corresponding reference phase positions.

Here, alignment of rising edges is taken as an example to illustrate the sequential calibration process.

Figure 5:
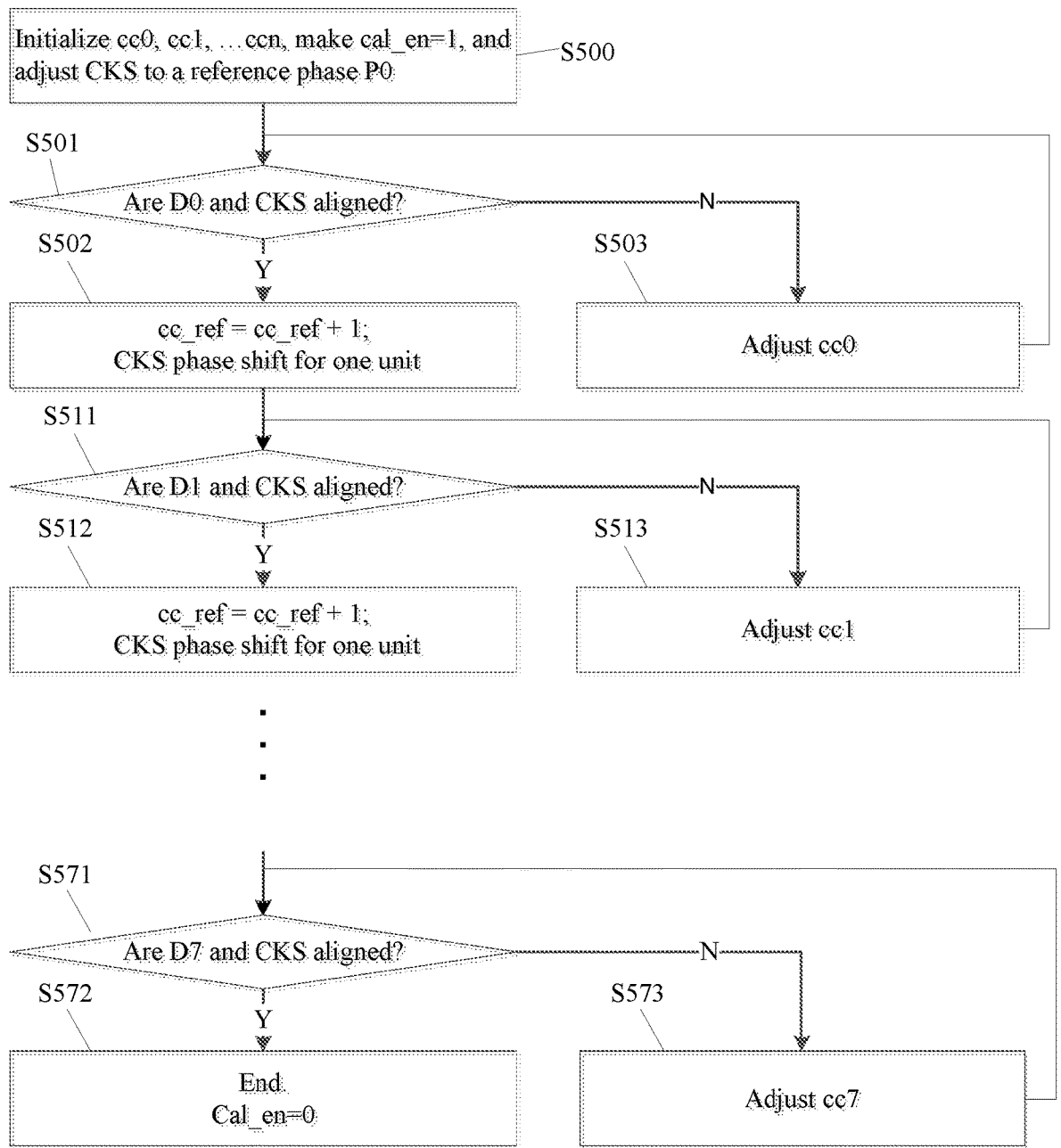
FIG. 5 is a flowchart showing sequentially calibrating first delay signals output by digitally controlled delay lines according to an embodiment of the present disclosure.

As shown in FIG. 5, at S500 the state machine 12 initializes the calibration control signals cc0, cc1, . . . ccn, and then the time-to-digital conversion circuit 11 outputs the first delay signals D0, D1, . . . Dn (n=7); the state machine 12 then sets the value of cal_en to be 1, and adjusts the delay control signal cc_ref so that the phase of the reference clock signal CKS is a reference phase P0.

Figure 4B:
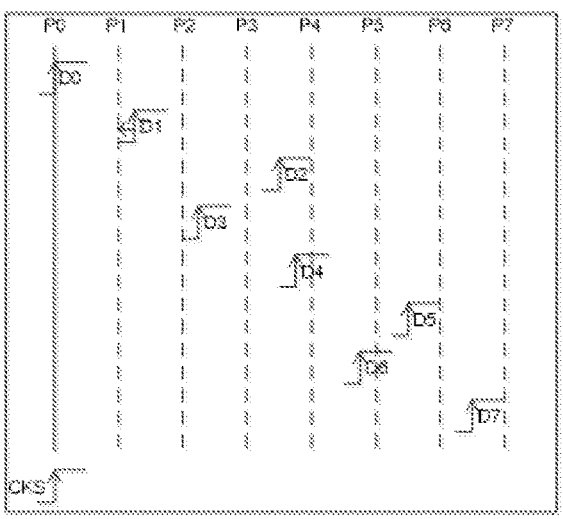

At S501, the phase detector DFF0 determines whether the rising edges of the first delay signal D0 and the reference clock signal CKS are aligned, and the phase detector DFF0 outputs the phase detection result signal to the state machine. If the rising edges of the first delay signal D0 and the reference clock signal CKS are not aligned, at S503 the state machine 12, according to the phase detection result signal, adaptively adjusts a calibration control signal cc0, to control the time-to-digital converter tdc_0 to adjust the first delay signal D0 until the rising edges are aligned (as shown in FIG. 4B). If the rising edges of the first delay signal D0 and the reference clock signal CKS are aligned, at S502 the state machine 12 keeps the calibration control signal cc0 unchanged, adjusts the delay control signal of the digitally controlled reference delay line to make cc_ref=cc_ref+1, and to shift the phase of reference clock signal CKS forwardly by a unit phase shift. Then, the signal obtained after the phase of the reference clock signal CKS is shifted becomes a corresponding reference clock signal for the next time-to-digital converter tdc_1 to be adjusted. At this time, the phase of the reference clock signal CKS is a reference phase P1.

Figure 4C:
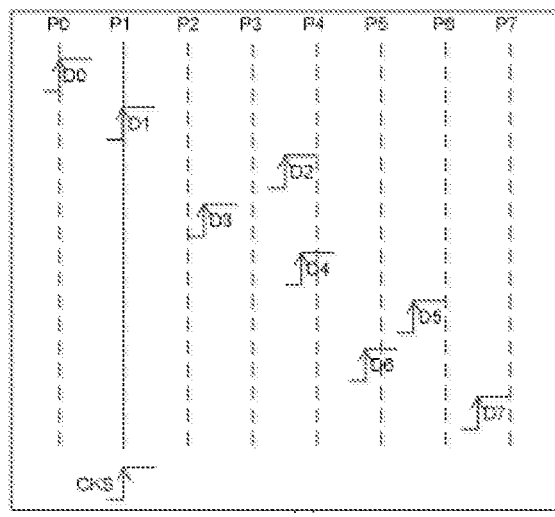
Figure 4D:
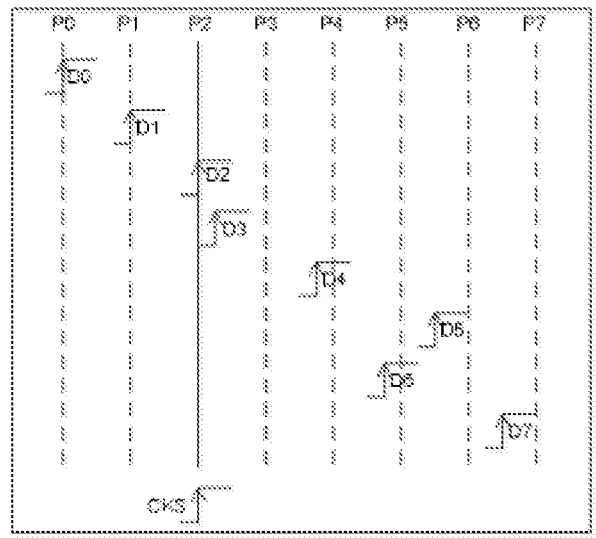
Figure 4E:
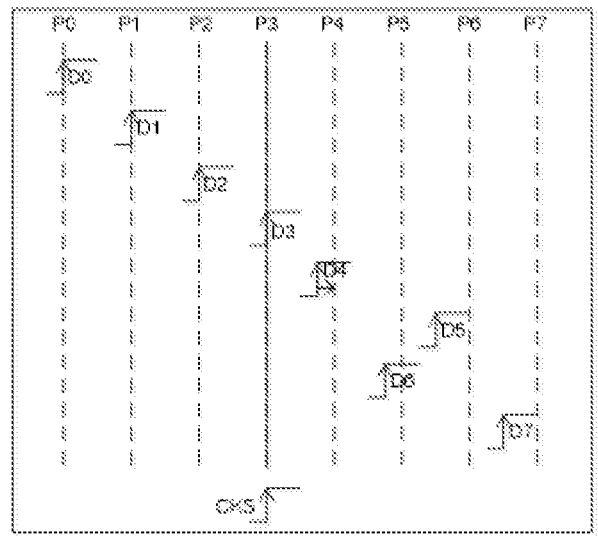

At S511, the phase detector DFF1 determines whether rising edges of the first delay signal D1 are aligned with the rising edges of the shifted reference clock signal CKS, and outputs a phase detection result signal to the state machine. If the rising edges are not aligned, at S513 the state machine 12, according to the result, adaptively adjusts a calibration control signal cc1, to control the time-to-digital converter tdc_1 to adjust the first delay signal D1 until the rising edges are aligned (as shown in FIG. 4C). If the rising edges are aligned, then the state machine 12 keeps the calibration control signal cc1 unchanged, adjusts the delay control signal of the digitally controlled reference delay line to make cc_ref=cc_ref+1, and to shift the phase of reference clock signal CKS forwardly by a unit phase shift. Then, the signal obtained after the phase of the reference clock signal CKS is shifted becomes a corresponding reference clock signal for the next time-to-digital converter tdc_2. At this time, the phase of the reference clock signal CKS is a reference phase P2.

Figure 4F:
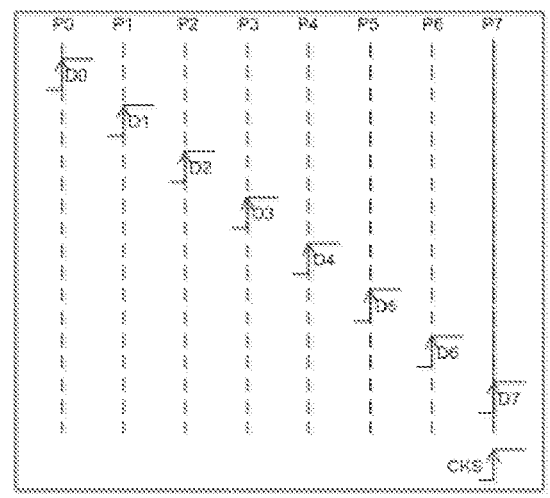
Figure 4G:
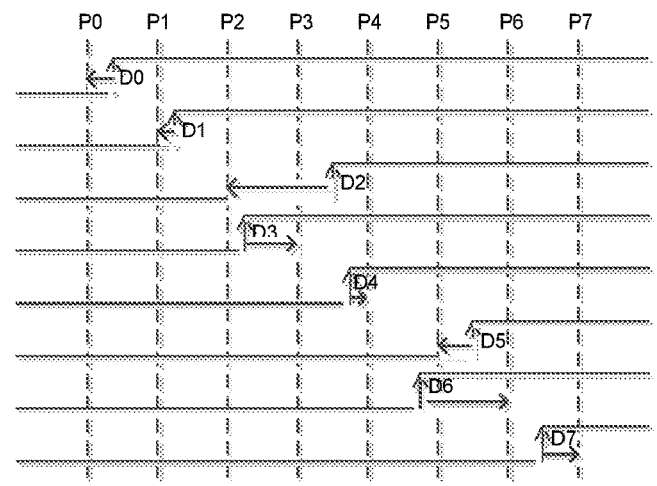
Figure 4G:
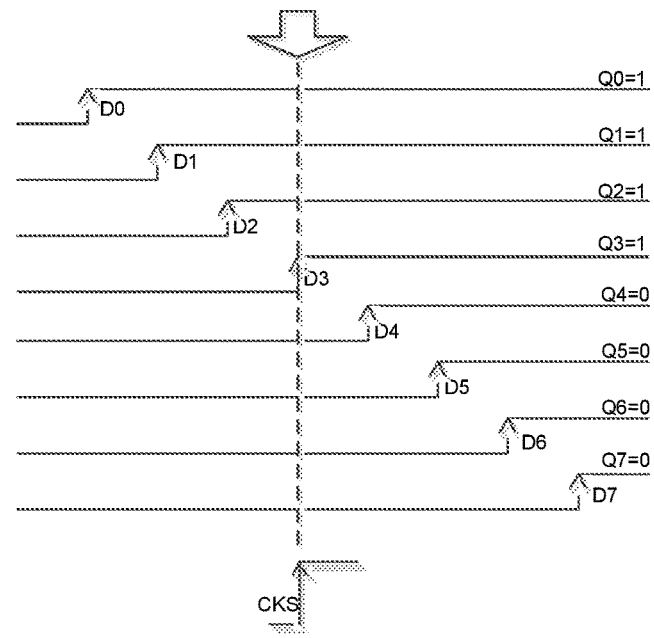

The processes are repeated, and at S571 the phase detector DFF7 determines whether the rising edge of the first delay signal D7 are aligned with the rising edge of the shifted reference clock signal CKS, and outputs a phase detection result signal to the state machine 12. If the rising edges are not aligned, at S573, the state machine 12 adjusts a calibration control signal cc7, to control the time-to-digital converter tdc_7 to adjust the first delay signal D7, so as to align the rising edges (as shown in FIG. 4F). If the rising edges of the first delay signals output by digitally controlled reference delay lines DTC0 to DCT7 are aligned respectively with the rising edges of corresponding reference clock signals, that means the first delay signals are evenly distributed in corresponding phase reference positions, calibration of the time-to-digital conversion circuit is completed, and the working mode is then switched on.

In some embodiments, for all first delay signals that are not yet calibrated, it is determined which first delay signal has a phase closest to the phase of the current reference clock signal, and the state machine will give priority to calibrating the first delay signal with the closest phase (hereinafter, closest distance calibration method). Specifically, for all first delay signals that are not yet calibrated, after controlling the reference clock signal CKS to shift phase for a unit phase shift to a reference phase position, if at least one first delay signal is detected, one of the first delay signals is selected for calibration; if none of the first delay signals to be calibrated are detected, the reference clock signal CKS continues to shift phase by one unit phase shift until at least one first delay signal is detected, and one of the first delay signals is selected for calibration.

The closest distance calibration method is different from the sequential calibration method in that, in the closest distance calibration method before to determine whether a first delay signal and the reference clock signal are aligned, the state machine 12 adjusts the delay control signal cc_ref so that the reference clock signal CKS shifts to a certain phase, if one or more first delay signals yet to be calibrated are detected, one of the delay signals is selected for calibration; if none of the first delay signals to be calibrated are detected, the reference clock signal CKS continues to shift phase by one unit phase shift. The state machine 12 monitor the phase detection result signal output by the phase detector, when at least one phase detection result is 1 (that is, at least one first delay signal yet to be calibrated is detected), the state machine 12 selects a first delay signal in the time-to-digital converter whose phase detection result is 1 for calibration, and moves the reference clock signal CKS back to the certain position. In some embodiments, the first delay signal with the phase closest to the phase of the reference clock signal is selected for calibration.

Figure 6A:
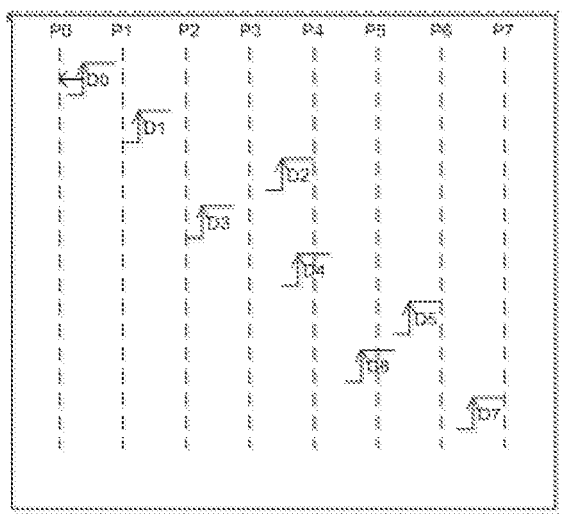
FIGS. 6A to 6G show schematic diagrams of a process of calibrating first delay signals in a shortest distance calibration mode with n=7 as an example according to an embodiment of the present disclosure.
Figure 6B:
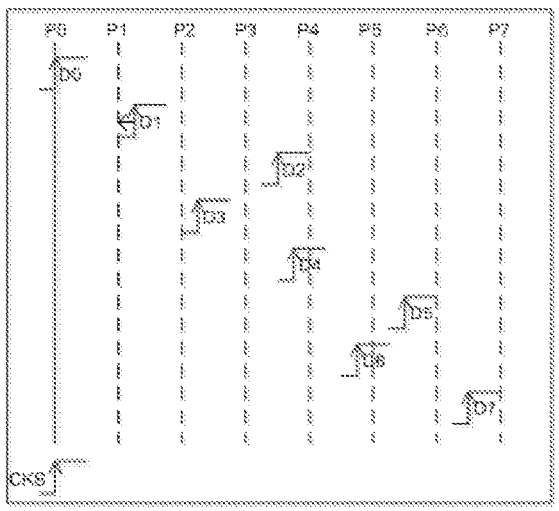
Figure 6C:
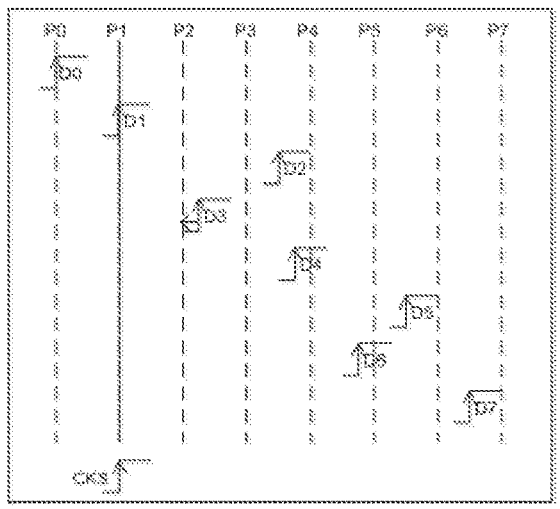
Figure 6D:
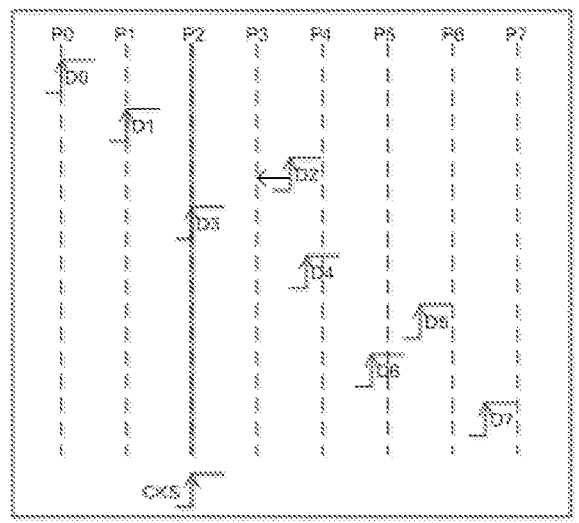

FIGS. 6A to 6G show schematic diagrams of a process of calibrating first delay signals in a shortest distance calibration mode with n=7 as an example according to some embodiments. FIG. 6A shows unadjusted first delay signals D0, D1, . . . , D7 output by the digitally controlled delay lines DTC0 to DTC7. As shown in FIGS. 6B to 6G, P0 to P7 represent different phase shift positions of the reference clock signal CKS. Here, alignment of rising edges is taken as an example to illustrate the closest distance calibration method.

Figure 6E:
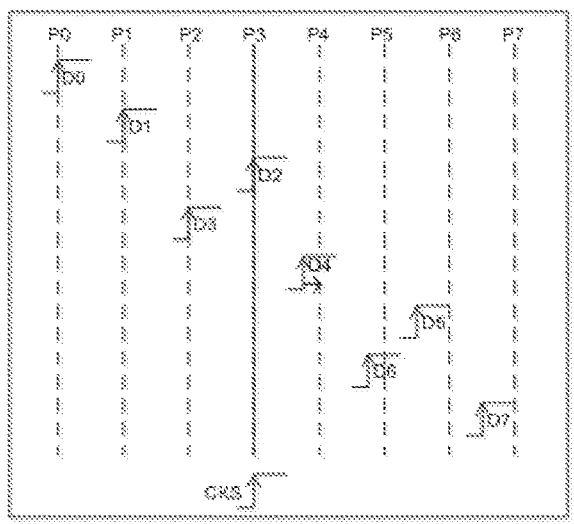
Figure 6F:
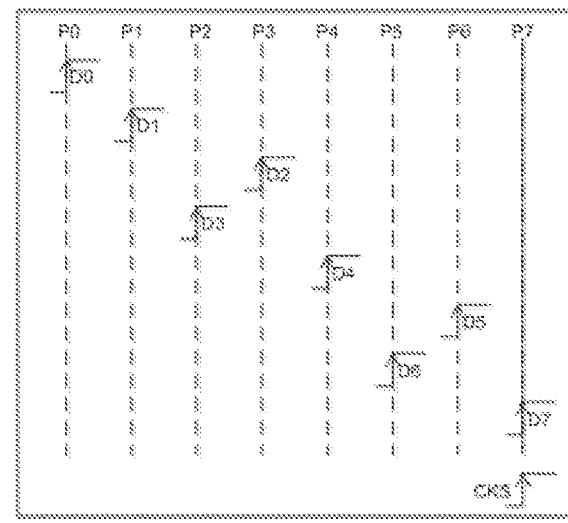
Figure 6G:
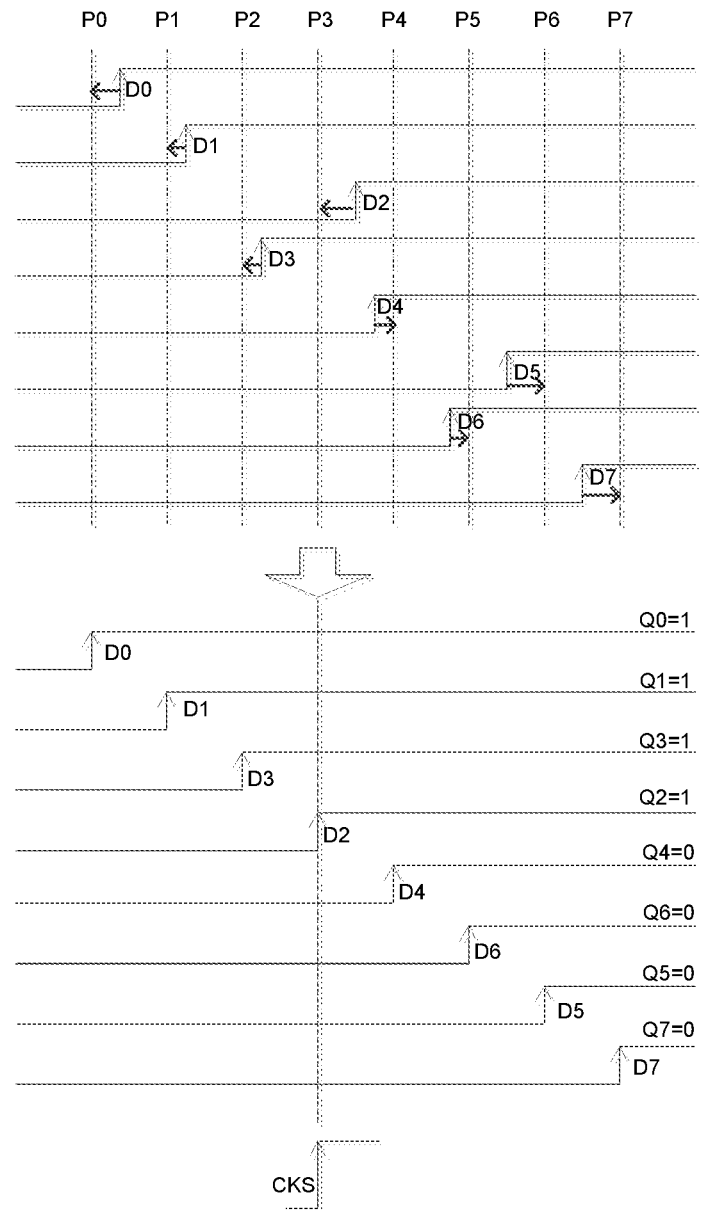

For the sake of brevity, the following takes the reference clock signal CKS at a P3 position as an example and with reference to FIGS. 6E and 6G to briefly describe the closest distance calibration method applied to the first delay signals. It is worth noting that, at this point, unadjusted first delay signals include D2, D4, D6, D5 and D7.

First, the state machine 12, according to the phase detection result signal output by the phase detector, adjusts the delay control signals, controls the reference clock signal CKS to shift its phase to position P3, and if no unadjusted first delay signal is detected (that is, none of the phase detection result of the phase detector DDF2, DDF4, DDF6, DDF5 and DDF7 is 1. The phase detector DDF2, DDF4, DDF6, DDF5 and DDF7 correspond to the first delay signals D2, D4, D6, D5 and D7, respectively), the state machine 12 controls the reference clock signal CKS to move forward to position P4.

At position P4, if the state machine detects that the phase detectors DFF2 and DFF4 have a phase detection result value of 1, that indicates that among the unadjusted first delay signals D2, D4, D6, D5 and D7, D2 and D4 have the phase closest to the phase of the reference clock signal CKS, and D6, D5 and D7 are farther away from the reference clock signal CKS; then the state machine will select one of D2 and D4 based on the order indicated by the labels as the next delay signal to be adjusted (here, namely D2); meanwhile, the state machine controls the reference clock signal CKS to return to position P3 as the reference clock signal of the next time-to-digital converter to be adjusted (i.e. tdc_2). Then, the phase detector DFF2 determines whether a rising edge of the first delay signal D2 are aligned with a rising edge of reference clock signal CKS at position P3, and the phase detector DFF2 outputs a phase detection result signal Q2 to the state machine 12; if the rising edges are not aligned, the state machine 12, according to the phase detection result signal Q2, adaptively adjusts a calibration control signal cc2, to control the time-to-digital converter tdc_2 to adjust the first delay signal D2 until the rising edges are aligned; if the rising edges are aligned, the state machine 12 keeps the calibration control signal unchanged, to keep the first delay signal D2 in an adjusted phase (at this point, calibration of the time-to-digital converter tdc_2 is completed). Meanwhile, the state machine 12 adjusts the delay control signal of the digitally controlled reference delay line to make cc_ref=cc_ref+1, so as to shift the reference clock signal CKS forwardly by a unit phase shift (that is, to position 3). The above processes are then repeated until the entire time-to-digital conversion circuit is calibrated.

The present disclosure also provides a digital phase-locked loop. The digital phase-locked loop includes a time-to-digital conversion circuit, a digitally controlled reference delay circuit, a state machine, and a decoder. The time-to-digital conversion circuit can be a time-to-digital conversion circuit according to one of embodiments of the present disclosure. The decoder is connected to an output terminal of the time-to-digital conversion circuit, and decodes the output signals of the time-to-digital conversion circuit into binary signals for output, which can be applied in interfaces of phase-locked loops. When the time-to-digital conversion circuit is calibrated, the state machine outputs a calibration enabling signal cal_en=0, switching the time-to-digital conversion circuit to a working mode. The time-to-digital conversion circuit, in the working mode, measures the phase difference between a first clock signal REF and a second clock signal CK_FB it receives, and outputs a phase detection result signal to the decoder. Then, the decoder decodes the phase detection result signal and output a binary digit.

Figure 7:
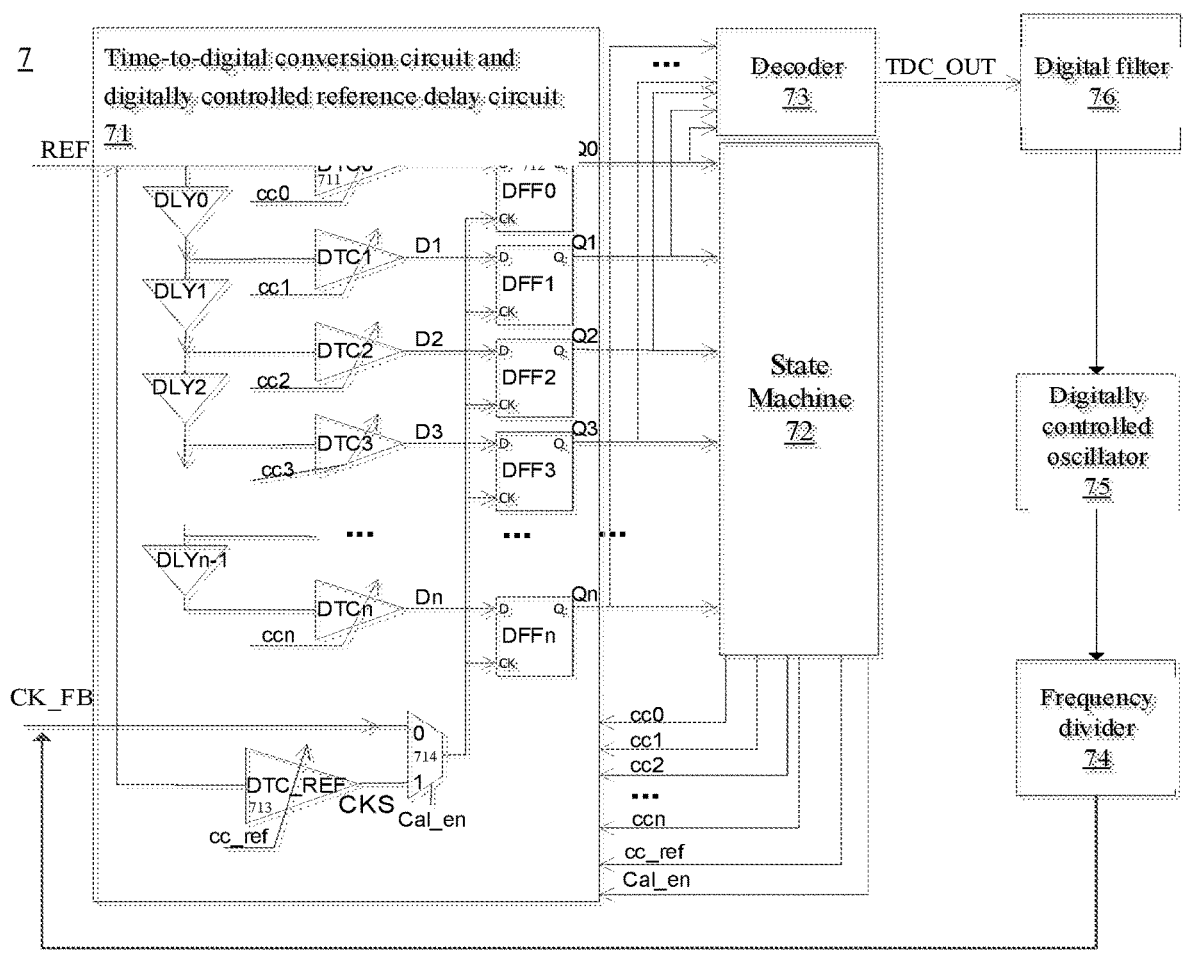
FIG. 7 is a schematic diagram of a digital phase-locked loop an embodiment of the present disclosure.

Referring to FIG. 7, a circuit diagram of a digital phase-locked loop 7 according to some embodiments is shown. As shown in FIG. 7, the digital phase-locked loop 7 includes a time-to-digital conversion circuit and digitally controlled reference delay circuit 71, a TDC state machine 72, and a decoder 73.

Still referring to FIG. 7, the digital phase-locked loop 7 also includes a frequency divider 74, a digitally controlled oscillator 75, and a digital filter 76. The decoder 73 is electrically connected to one or more output terminals of the time-to-digital conversion circuit. When the time-to-digital conversion circuit is in the working mode, a selector selects a second clock signal CK_FB output by the frequency divider 74 as output. The digitally controlled oscillator 75 and the frequency divider 74 are electrically connected, the digital filter 76 and the digitally controlled oscillator 75 are electrically connected. The time-to-digital conversion circuit and digitally controlled reference delay circuit 71 in the digital phase-locked loop 7 have the same functions as the time-to-digital conversion circuit 11 and the digitally controlled reference delay circuit 10. And the TDC state machine 72 has the same function as the state machine 12. Those skilled in the art should be able to implement the time-to-digital conversion circuit and digitally controlled reference delay circuit 71 and TDC state machine 72 based on the present disclosure of the time-to-digital conversion circuit 11, the digitally controlled reference delay circuit 10, and the state machine 12.

The execution orders of various steps enumerated in the present disclosure are only examples of the presently disclosed techniques, and are not intended to limit aspects of the presently disclosed invention. Any omission or replacement of the steps, and extra steps consistent with the principles of the present invention are within the scope of the present disclosure.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

LIST OF REFERENCE NUMERALS 1 linear calibration system for time-to-digital converter
10 digitally controlled reference delay circuit
11 time-to-digital conversion circuit
12 state machine
7 digital phase locked loop
71 time-to-digital conversion circuit and digitally controlled reference delay circuit
72 TDC state machine
73 decoder
74 frequency divider
75 digitally controlled oscillator
76 digital filter
S31-S34 steps of a linear calibration method for time-to-digital converter
S501-S573 steps of sequentially calibrating a first delay signal output by each digitally controlled delay line

We claim:
1. A linear calibration system for a time-to-digital converter, comprising:
a digitally controlled reference delay circuit;
a time-to-digital conversion circuit; and
a state machine, wherein in a calibration mode,
the digitally controlled reference delay circuit receives a first clock signal, delays the first clock signal, and outputs a reference clock signal,
the time-to-digital conversion circuit is connected to the digitally controlled reference clock signal and comprises at least two time-to-digital converters, and each time-to-digital converter receives the first clock signal and the reference clock signal, delays the first clock signal to output a first delay signal, compares a phase of the first delay signal with a phase of the reference clock signal, and output a phase detection result signal, and
the state machine is connected to the digitally controlled reference delay circuit and the time-to-digital conversion circuit, generates a delay control signal controlling the digitally controlled reference delay circuit for each the time-to-digital converter, and adaptively adjusts a calibration control signal for calibrating the time-to-digital converter according to the phase detection result signal, to align the phase of the first delay signal and the phase of the reference clock signal.

2. The linear calibration system for a time-to-digital converter according to claim 1, wherein each of the time-to-digital converters comprises:
a digitally controlled delay line, receiving the first clock signal and delaying the first clock signal under control of the state machine; and
a phase detector, connected to the digitally controlled delay line and the digitally controlled reference delay circuit, wherein the phase detector compares a rising edge or falling edge of the first delay signal with a rising edge or falling edge of the reference clock signal, and outputs a phase detection result signal to the state machine.

3. The linear calibration system for a time-to-digital converter according to claim 2, wherein the digitally controlled reference delay circuit comprises:
a digitally controlled reference delay line, wherein the digitally controlled reference delay line receives the first clock signal, delays the first clock signal, and outputs a reference clock signal.

4. The linear calibration system for a time-to-digital converter according to claim 3, wherein the state machine adjusts a clock delay signal of the digitally controlled reference delay line or a calibration control signal for calibrating a corresponding time-to-digital converter, until the phase detection result signal output by the phase detector indicates that the rising edge or falling edge of the first delay signal and the rising edge or falling edge of the reference clock signal are aligned.

5. The linear calibration system for a time-to-digital converter according to claim 4, wherein the state machine, according to the phase detection result signal, adaptively adjusts a corresponding calibration control signal to control a corresponding time-to-digital converter to adjust the rising edge or falling edge of the first delay signal, until the rising edge or falling edge of the first delay signal and the rising edge or falling edge of the reference clock signal are aligned.

6. The linear calibration system for a time-to-digital converter according to claim 4, wherein the state machine keeps the calibration control signal unchanged when the phase detection result signal indicates that the rising edge or falling edge of the first delay signal and the rising edge or falling edge of the reference clock signal are aligned, to make the first delay signal stay in a adjusted phase.

7. The linear calibration system for a time-to-digital converter according to claim 6, wherein the state machine adjusts the delay control signal controlling the digitally controlled reference delay circuit, to shift the phase of the reference clock signal forwardly by at least one unit phase shift, and outputs the reference clock signal after its phase is shifted.

8. The linear calibration system for a time-to-digital converter according to claim 2, wherein the digitally controlled reference delay circuit includes a selector, and the selector comprises a first input terminal and a second input terminal,
wherein the first input terminal is connected to an output terminal of the digitally controlled reference delay circuit,
wherein the second input terminal receives a second clock signal, an output terminal of the selector is connected to the digital-to-time conversion circuit, and the selector, under control of the state machine, switches the time-to-digital conversion circuit between the calibration mode and a working mode.

9. The linear calibration system for a time-to-digital converter according to claim 8, wherein in the calibration mode, the selector outputs the reference clock signal, wherein in the working mode, the selector outputs the second clock signal.

10. The linear calibration system for a time-to-digital converter according to claim 2, further comprises:
an adder, which accumulates or decodes the phase detection result into a binary output.

11. The linear calibration system for a time-to-digital converter according to claim 2, wherein a delay line is disposed between each two adjacent time-to-digital converters.

12. A linear calibration method for a time-to-digital converter, for each of a plurality of time-to-digital converters, comprising:
receiving a first clock signal, by the time-to-digital converter, delaying the first clock signal to generate a first delay signal;
receiving the first clock signal, by a digitally controlled reference delay circuit, delaying the first clock signal to generate a reference clock signal;
comparing, by the time-to-digital converter, the phase of the first delay signal and the phase of the reference clock signal and outputting a phase detection result signal; and
adjusting, by a state machine, a calibration control signal which calibrates the time-to-digital converter, according to the phase detection result signal, to align the phase of the first delay signal and the phase of the reference clock signal.

13. The linear calibration method for a time-to-digital converter according to claim 12, wherein the comparing the phase of the first delay signal and the phase of the reference clock signal further comprises:
comparing a rising edge or falling edge of the first delay signal with a rising edge or falling edge of the reference clock signal.

14. The linear calibration method for a time-to-digital converter according to claim 13, wherein the adjusting a calibration control signal which calibrates the time-to-digital converter according to the phase detection result signal further comprises:
adjusting a clock delay signal of a digitally controlled reference delay line or a calibration control signal for calibrating a corresponding time-to-digital converter according to the phase detection result signal indicating that the rising edge or falling edge of the first delay signal is not aligned with the rising edge or falling edge of the reference clock signal.

15. The linear calibration method for a time-to-digital converter according to claim 14, wherein the adjusting a calibration control signal which calibrates the time-to-digital converter according to the phase detection result signal further comprises:
adaptively adjusting the calibration control signal to control the time-to-digital converter to adjust the rising edge or falling edge of the first delay signal according to the phase detection result signal, until the rising edge or falling edge of the first delay signal are aligned with the rising edge or falling edge of the reference clock.

16. The linear calibration method for a time-to-digital converter according to claim 15, wherein the adjusting a calibration control signal which calibrates the time-to-digital converter according to the phase detection result signal further comprises:

keeping the calibration control signal unchanged according to the phase detection result signal indicating that the rising edge or falling edge of the first delay signal is aligned with the rising edge or falling edge of the reference clock signal, to make the first delay signal stay in a adjusted phase.

17. The linear calibration method for a time-to-digital converter according to claim 16, wherein the adjusting a calibration control signal which calibrates the time-to-digital converter according to the phase detection result signal further comprises:

shifting the phase of the reference clock signal forwardly by at least one unit phase shift, and outputting the reference clock signal after its phase is shifted.

18. The linear calibration method for a time-to-digital converter according to claim 12, further comprises:

among the time-to-digital converters that are not adjusted, first adjusting the time-to-digital converter that outputs the first delay signal with a phase closest to the phase of the reference clock signal.

19. A digital phase-locked loop, comprising:
a decoder;
a digitally controlled reference delay circuit;
a time-to-digital conversion circuit; and
a state machine,
   wherein in a calibration mode,
      the digitally controlled reference delay circuit receives a first clock signal, delays the first clock signal, and outputs a reference clock signal,
      the time-to-digital conversion circuit is connected to the digitally controlled reference clock signal and comprises at least two time-to-digital converters, and each time-to-digital converter receives the first clock signal and the reference clock signal, delays the first clock signal to output a first delay signal, compares a phase of the first delay signal with a phase of the reference clock signal, and output a phase detection result signal, and
      the state machine is connected to the digitally controlled reference delay circuit and the time-to-digital conversion circuit, generates a delay control signal controlling the digitally controlled reference delay circuit for each the time-to-digital converter, and adaptively adjusts a calibration control signal for calibrating the time-to-digital converter according to the phase detection result signal, to align the phase of the first delay signal and the phase of the reference clock signal,
   wherein the time-to-digital converter comprises:
      a digitally controlled delay line, receiving the first clock signal and delaying the first clock signal under control of the state machine; and
      a phase detector, connected to the digitally controlled delay line and the digitally controlled reference delay circuit, wherein the phase detector compares a rising edge or falling edge of the first delay signal with a rising edge or falling edge of the reference clock signal, and outputs a phase detection result signal to the state machine;
   wherein the digitally controlled reference delay circuit includes a selector, and the selector comprises a first input terminal and a second input terminal, the first input terminal is connected to an output terminal of the digitally controlled reference delay circuit, the second input terminal receives a second clock signal, an output terminal of the selector is connected to the digital-to-time circuit, and the selector, under control of the state machine, switches the time-to-digital conversion circuit between the calibration mode and a working mode,
   wherein the decoder is connected to the time-to-digital conversion circuit, and when the time-to-digital conversion circuit is in the working mode, the time-to-digital conversion circuit measures the phase difference between the first clock signal and the second clock signal and outputs the phase detection result signal to the decoder, and the decoder decodes the phase detection result signal into a binary output.

20. The digital phase-locked loop according to claim 19, further comprises:
a frequency divider, connected to the second input terminal of the selector when the time-to-digital converters are in the working mode;
a digitally controlled oscillator, connected to the frequency divider; and
a digital filter, connected to the digitally controlled oscillator.

* * * * *